United States Patent
Zeller

(10) Patent No.: US 11,662,415 B2
(45) Date of Patent: May 30, 2023

(54) ASCERTAINING A PSF FOR RECONSTRUCTING IMAGE DATA FROM SCAN DATA RECORDED BY MEANS OF A MAGNETIC RESONANCE SYSTEM

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/488,548

(22) Filed: Sep. 29, 2021

(65) Prior Publication Data

US 2022/0099779 A1 Mar. 31, 2022

(30) Foreign Application Priority Data

Sep. 29, 2020 (DE) .......................... 102020212250.4

(51) Int. Cl.
*G01R 33/565* (2006.01)
*G01R 33/561* (2006.01)
*G01R 33/56* (2006.01)

(52) U.S. Cl.
CPC ... *G01R 33/56545* (2013.01); *G01R 33/5608* (2013.01); *G01R 33/5611* (2013.01)

(58) Field of Classification Search
CPC .......... G01R 33/56545; G01R 33/5608; G01R 33/5611; G01R 33/561; G01R 33/4826
See application file for complete search history.

(56) References Cited

U.S. PATENT DOCUMENTS

| 8,981,776 B2 | 3/2015 | Setsompop et al. |
| 2018/0143277 A1 | 5/2018 | Chen et al. |
| 2018/0164395 A1 | 6/2018 | Setsompop et al. |
| 2020/0132795 A1 | 1/2020 | Dimberg et al. |

(Continued)

FOREIGN PATENT DOCUMENTS

| DE | 102018218471 B3 | 2/2020 |
| JP | 2005253702 A | * 9/2005 |

OTHER PUBLICATIONS

Schwarz, Jolanda M., et al. GRAPPA reconstructed wave-CAIPI MP-RAGE at 7 Tesla. Magnetic resonance in medicine, 2018, 80. Jg., Nr. 6, S. 2427-2438.

(Continued)

*Primary Examiner* — Susan S Lee
(74) *Attorney, Agent, or Firm* — Banner & Witcoff Ltd,

(57) ABSTRACT

Techniques are disclosed for ascertaining a point spread function (PSF) for reconstructing image data from scan data recorded by means of a magnetic resonance system. The techniques include a comparison of values determined for a planned k-space trajectory for parameters characterizing the k-space trajectory with baseline values of the parameters characterizing the k-space trajectory deposited in a database for the magnetic resonance system, in each case together with an associated point spread function PSF to ascertain baseline values of the deposited baseline values that are as similar as possible to the values determined for the planned k-space trajectory for the parameters characterizing the k-space trajectory and, on the basis of this deposited PSF, a PSF to be used for a reconstruction of final image data is ascertained.

17 Claims, 3 Drawing Sheets

(56) References Cited

U.S. PATENT DOCUMENTS

2022/0187406 A1* 6/2022 Wang .............. G01R 33/56509

OTHER PUBLICATIONS

Zaitsev, M.; Hennig, J.; Speck, 0. Point spread function mapping with parallel imaging techniques and high acceleration factors: Fast, robust, and flexible method for echo-planar imaging distortion correction. Magnetic Resonance in Medicine: An Official Journal of the International Society for Magnetic Resonance in Medicine, 2004, 52. Jg., Nr. 5, S. 1156-1166.

Gagoski, Borjan A. et al. "RARE/Turbo Spin Echo Imaging with Simultaneous Multislice Wave-CAIPI" Magnetic Resonance in Medicine; vol. 73; pp. 929-938; 2015 // DOI: 10.1002/mrm.2561.

Polak, D. et al., "Highly-accelerated volumetric brain examination using optimized wave-CAIPI encoding," J. Magn. Reson. Imaging, vol. 50, No. 3, pp. 961-974, 2019.

Cauley, Stephen F. et al. "Autocalibrated Wave-CAIPI Reconstruction; Joint Optimization of k-Space Trajectory and Parallel Imaging Reconstruction" Magnetic Resonance in Medicine, vol. 78, No. 3, pp. 1093-1099, 2016 // DOI 10.1002/mrm.26499.

Breuer, Felix A. et al.: "Controlled Aliasing in Parallel Imaging Results in Higher Acceleration (CAIPIRINHA) for Multi-Slice Imaging"; in: Magnetic Resonance in Medicine 53: S. 684-691 (2005); 2005.

Setsompop, Kawin et al.: "Blipped-Controlled Aliasing in Parallel Imaging for Simultaneous Multislice Echo Planar Imaging with Reduced g-Factor Penalty"; in: Magnetic Resonance in Medicine; vol. 67; pp. 1210-1224; 2012.

Chen et al. "Self-Calibrating Wave-Encoded Variable-Density Single-Shot Fast Spin Echo Imaging", J. Magn. Reson. Imaging 2018;47:954-966.

Bilgic, Berkin et al. "Wave-CAIPI for Highly Accelerated 3D Imaging" Magnetic Resonance in Medicine, vol. 73, No. 6, pp. 2152-2162, Jun. 2015 (First published: Jul. 1, 2014) // https://doi.org/10.1002/mrm.25347.

German action dated Aug. 20, 2021, Application No. 10 2020 212 250.4.

B. Bilgic et al., "Wave-CAIPI for Highly Accelerated 3D Imaging", Full Paper, Magnetic Resonance in Medicine (2014), pp. 1-11.

* cited by examiner

ASCERTAINING A PSF FOR RECONSTRUCTING IMAGE DATA FROM SCAN DATA RECORDED BY MEANS OF A MAGNETIC RESONANCE SYSTEM

CROSS-REFERENCE TO RELATED APPLICATIONS

The present application claims the benefit of the filing date of Germany patent application no. DE 10 2020 212 250.4, filed on Sep. 29, 2020, the contents of which are incorporated herein by reference in their entirety.

TECHNICAL FIELD

The disclosure relates to ascertaining a PSF for reconstructing image data from scan data recorded by means of a magnetic resonance system.

BACKGROUND

Magnetic resonance (MR) technology is a known technology with which images of the interior of an examination object can be generated. In simplified terms, for this purpose the examination object is positioned in a magnetic resonance device in a relatively strong static homogeneous basic magnetic field, also called the B0 field, with field strengths of 0.2 tesla to 7 tesla or more, such that the nuclear spins thereof are oriented along the basic magnetic field. To trigger nuclear spin resonances, which can be scanned as signals, radio-frequency pulses (RF pulses) are radiated into the examination object, and the nuclear spin resonances triggered are scanned as so-called k-space data, which is used as the basis for reconstructing MR images or ascertaining spectroscopy data.

For position encoding of the scan data, rapidly switched magnetic gradient fields, gradients for short, are overlaid on the basic magnetic field. A scheme used, which describes a temporal sequence of RF pulses to be radiated and gradients to be switched, is referred to as a pulse sequence or sequence for short. The scan data recorded is digitized and stored as complex numerical values in a k-space matrix. An associated MR image can be reconstructed from the k-space matrix loaded with values, for example, by means of a multi-dimensional Fourier transform.

SUMMARY

MR scans may include so-called parallel acquisition techniques (PPAs), such as e.g. GRAPPA ("GeneRalized Autocalibrating Partially Parallel Acquisition") or SENSE ("Sensitivity Encoding") which, with the aid of a plurality of RF coils, only a number of scan data items undersampled in k-space according to the Nyquist theorem are recorded, in order, for example, to reduce the overall scan time required to record the scan data or to increase the resolution. Here, the "missing" scan data, i.e., data that is not scanned but is required according to the Nyquist method for a complete set of scan data, is supplemented on the basis of sensitivity data of the RF coils used, calibration data, and the scanned scan data.

On the other hand, the desire for ever faster MR recordings in the clinical environment is leading to a resurgence of methods in which a plurality of images are recorded simultaneously. In general, these methods can be characterized in that, at least during part of the scan, targeted transverse magnetization of at least two slices is used simultaneously for the imaging process ("multi-slice imaging", "slice multiplexing", "simultaneous multi-slice" (SMS)). In contrast thereto, in established "multi-slice imaging", the signal is recorded from at least two slices alternately, i.e., completely independently of one another with a correspondingly longer scan time.

Known SMS methods are, for example, use methods from the aforementioned imaging by means of PPA. In doing so, knowledge regarding the sensitivity distribution of the receiving coils used during the acquisition of the scan data is utilized as additional information in order to fill in undersampled scan data according to the Nyquist method in the slice direction. This enables the separation of signals recorded to be overlaid from several layers into signals of the individual slices. These methods also include, for example, the CAIPIRINHA technique, as described by Breuer et al. in "Controlled Aliasing in Parallel Imaging Results in Higher Acceleration (CAIPIRINHA) for Multi-Slice Imaging", Magnetic Resonance in Medicine 53, 2005, pp 684-691, and the blipped CAIPIRINHA technique, as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp 1210-1224, wherein the g-factor (short for "geometry factor") mentioned in the latter publication represents a measure for the separability of the different receiving coils used.

As a method for further reducing the g-factor, CAIPIRINHA methods may be used to change the readout trajectories in k-space, and thus the acquisition scheme such that the scan data is acquired along wave-shaped or helical readout trajectories. This is, for example, described in U.S. Pat. No. 8,981,776, in the article by Bilgic et al. "Wave-CAIPI for Highly Accelerated 3D Imaging", Magnetic Resonance in Medicine 73:2152-2162 (2015), or, for two-dimensional (2D) imaging in Chen et al. "Self-Calibrating Wave-Encoded Variable-Density Single-Shot Fast Spin Echo Imaging", J. Magn. Reson. Imaging 2018, 47:954-966, or also for spin echo (SE) methods in Gagoski et al. "RARE/Turbo Spin Echo Imaging with Simultaneous Multislice Wave-CAIPI", Magn. Reson. Med. 73:929-938 (2015).

In short, for such wave techniques, at least one sinusoidally-modulated gradient is played out in a direction perpendicular to the readout direction simultaneously with a gradient during the readout process. A wave-shaped or helical k-space trajectory obtained in this way distributes artifacts, such as, for example, aliasing artifacts, which may occur due to undersampling of the k-space applied to reduce the scan time, in at least two, or, for helical k-space trajectories, in all spatial directions. Hence, this technique makes it possible to use sensitivity data of the RF coils used in several (all three) spatial directions, which leads to the aforementioned reduction of the g-factor. Hence, wave techniques enable, for example, higher accelerations, i.e., stronger undersampling to be applied while maintaining the same quality of the image data obtained compared to "non-wave PPA techniques" with lower acceleration.

The effect of the modulated gradients, also called wave gradients, on magnetization m at a spatial point wave (x,y,z) can be described as multiplication with a so-called "point spread function" PSF, which describes the propagation of aliasing artifacts by subsampling schemes in accordance with the Equation 1 below as follows:

$$\text{Wave}(x,y,z) = F^{-1}_x \text{PSF}(k_x,y,z) F_x m(x,y,z) \qquad \text{Eqn. 1:}$$

In accordance with Eqn. 1 above, $F_x$ stands for a Fourier transform, $F^{-1}_x$ for the inverse Fourier transform, and PSF $(k_x,y,z)$ for the PSF depicted in the hybrid $k_x$-y-z space for a wave gradient. The PSF describes the effect of the modulated gradients on the imaging phase in the $k_x$ direction, and may be separated into terms dependent on y and z in each case. Therefore, as in the aforementioned article by Bilgic et al., aliasing artifacts can be cancelled by "unaliasing" by means of a SENSE reconstruction. This is, for example, described in more detail in the article by Polak et al. "Highly-Accelerated Volumetric Brain Examination Using Optimized Wave-CAIPI Encoding", J. Magn. Reason. Imaging 2019, 50:961-974.

Ideally, the PSFs of sinusoidally or cosinusoidally modulated gradients are also sinusoidal or cosinusoidal. Therefore, a modulation transfer function (MTF) obtained by a Fourier transform of such a PSF should have only one frequency component. However, in reality, a spectrum of a real PSF described by an MTF is usually broadened by imperfections of the gradients used during the readout process, which may, for example, be caused by eddy currents, delays in the switched gradients, etc. Therefore, a reconstruction of image data using an ideal PSF leads to blurring in the reconstructed image data.

Hence, wave techniques have been found to be particularly sensitive to imperfections of the gradients used during the readout process, so that deviations of the gradients actually generated during a scan during a readout period from the respective ideal gradients planned for this readout period lead to artifacts in the image data that is ultimately obtained.

However, such deviations of gradients actually generated during a scan during a readout period from the respective gradients planned for this readout period occur regularly, for example due to high currents in the respective gradient coils and effects caused thereby, such as eddy currents, higher order fields, etc.

Attempts have been made to retrospectively mitigate the aforementioned deviations by observing known static constant time delays of the respective gradient coils during the reconstruction. However, this procedure disregards frequency-dependent components of the delays in the switched gradients and deviations caused thereby, as well as any deviations of the achieved magnitudes of the switched gradients from the planned gradients, and thus this inflexible approach can only achieve a possibly insufficient removal of artifacts.

Furthermore, for example, the article by Cauley et al. "Autocalibrated Wave-CAIPI Reconstruction; Joint Optimization of k-Space Trajectory and Parallel Imaging Reconstruction", Magnetic Resonance in Medicine 78, 2017, pp 1093-1099, described an iterative method which varies frequency parameters of the so-called "point spread function" PSF describing the propagation of aliasing artifacts from undersampling schemes and compares the reconstruction results obtained with the different frequency parameters at selected test positions via their root-mean-square-error (RMSE). If the RMSE approaches a local minimum, the associated value of the frequency parameters is assumed to be that of the sought-after PSF. The PSF found is used as the basis for correcting the deviation of the gradients for wave k-space trajectories. However, a disadvantage of this method is the possibly lengthy time required to find the sought-after PSF.

The disclosure is based on the object of enabling point spread functions PSFs to be ascertained in a fast and less complex manner that current systems.

The object is achieved by the method for recording scan data by means of a magnetic resonance system, the magnetic resonance system, the computer program, and the electronically readable data carrier as described throughout the disclosure, including the claims.

A technique according to the disclosure for ascertaining a point spread function (PSF) for reconstructing image data from scan data recorded by means of a magnetic resonance system comprises the following steps:

a) loading a k-space trajectory planned for a magnetic resonance measurement;

b) determining, in each case, a value that is valid for the planned k-space trajectory from at least one parameter characterizing the planned k-space trajectory;

c) comparing values determined for the planned k-space trajectory for the parameters characterizing the k-space trajectory with baseline values of the parameters characterizing the k-space trajectory deposited in a database for the magnetic resonance system, in each case, together with an associated point spread function PSF to ascertain baseline values of the deposited baseline values that are as similar as possible to the values determined for the planned k-space trajectory for the parameters characterizing the k-space trajectory;

d) recording scan data using the planned k-space trajectory;

e) reconstructing image data on the basis of the recorded scan data and the PSF associated with the baseline values ascertained; and f) checking reconstructed image data according to a quality criterion, wherein if the quality criterion is not fulfilled, a further PSF (PSFi) is determined with which step e) is carried out again and, if the quality criterion is fulfilled, the last PSF (PSFi) ascertained (e.g. the most recent) is used for the reconstruction of final image data BD.

The disclosure is based on the knowledge that deviations of actual PSFs from ideal PSFs primarily depend on hardware-specific properties of the magnetic resonance system used.

Therefore, a PSF for a k-space trajectory on a magnetic resonance system with given hardware should not change (significantly). The ascertaining of PSFs to be used for a reconstruction of final image data can be accelerated considerably by using a database.

The use of baseline values deposited (i.e. stored) in a database for a magnetic resonance system used for parameters characterizing a k-space trajectory to be applied and the associated PSF means that the existing hardware conditions of the magnetic resonance system are taken into account from the onset, and actual PSFs for an optimized reconstruction of image data can be determined significantly faster than conventional techniques. This enables waiting times that would otherwise be required for the determination of the PSF to be eliminated (or at least reduced).

A magnetic resonance system according to the disclosure comprises a magnet unit, a gradient unit, a radio-frequency unit, and a control facility with a PSF-determining-unit embodied to carry out one or more methods according to the disclosure.

A computer program according to the disclosure implements a method according to the disclosure on a control facility when it is executed on the control facility.

The computer program may also be provided in the form of a computer program product, which can be loaded directly into a memory (e.g. a non-transitory computer-readable medium) of a control facility with program code means for executing a method according to the disclosure when the computer program product is executed in the computing unit of the computing system.

An electronically readable data carrier according to the disclosure comprises electronically readable control information stored thereon which comprises at least one computer program according to the disclosure and is implemented to carry out a method according to the disclosure when the data carrier is used in a control facility of a magnetic resonance system.

The advantages and embodiments disclosed in relation to the method apply analogously to the magnetic resonance system, the computer program product, and the electronically readable data carrier.

BRIEF DESCRIPTION OF THE DRAWINGS/FIGURES

Further advantages and details of the present disclosure are described from the exemplary embodiments described below and with reference to the drawings. The examples given do not constitute a restriction of the disclosure. In the drawings.

DETAILED DESCRIPTION

Figure 1:
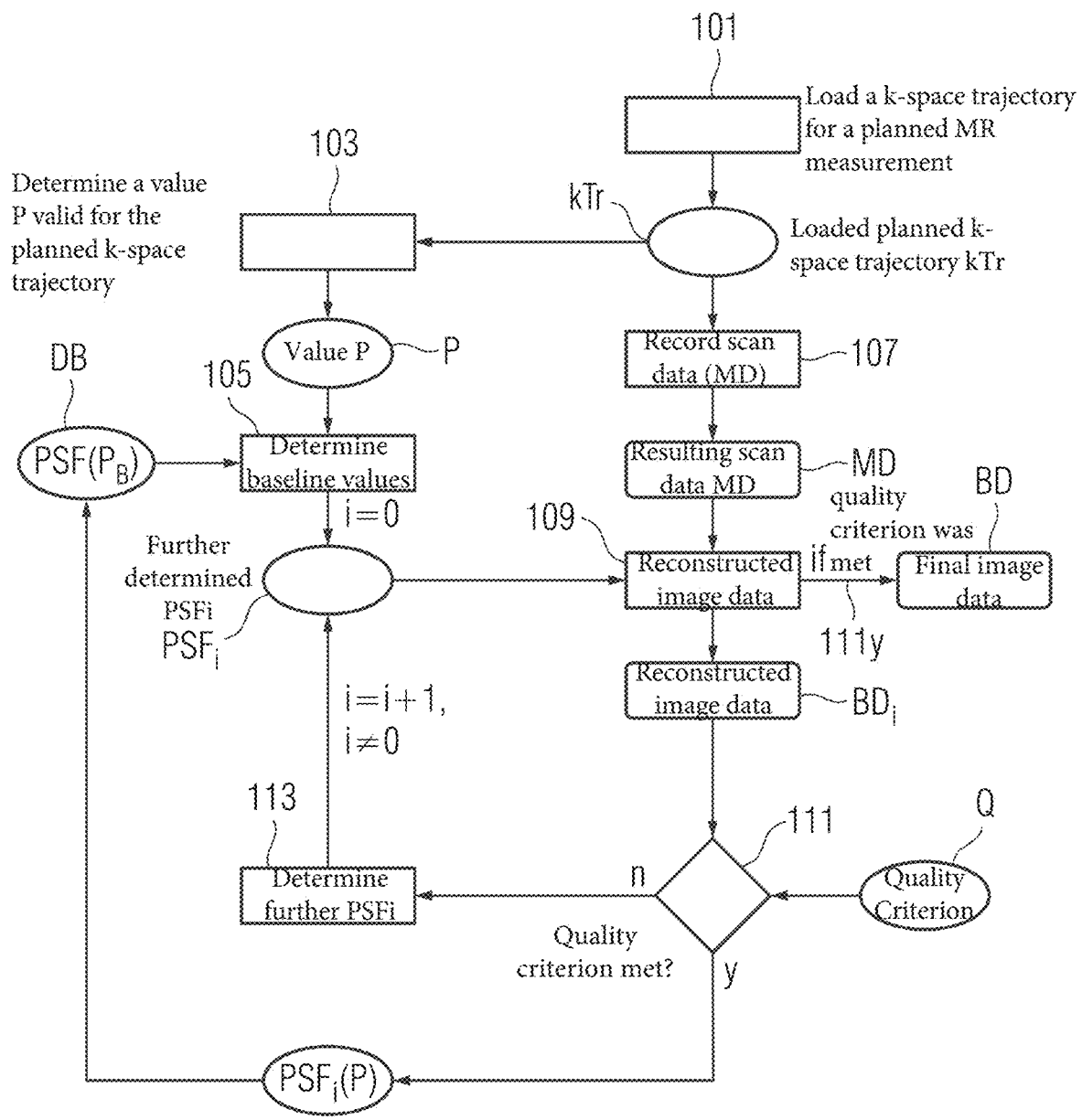
FIG. 1 shows a schematic flowchart of a method according to one or more embodiments of the disclosure.

FIG. 1 shows a schematic flowchart of a method according to one or more embodiments of the disclosure for ascertaining a PSF for reconstructing image data from scan data recorded by means of a magnetic resonance system.

In the method, a k-space trajectory kTr planned for a magnetic resonance measurement is loaded (block 101). Loading of planned k-space trajectories kTr can e.g. comprise loading the gradient fields Gx, Gy, Gz, which nominally have to be switched to obtain a desired k-space trajectory. A loaded k-space trajectory may have been calculated in advance in a known manner. A loaded k-space trajectory kTr is e.g. a k-space trajectory which may have imperfections leading to deviations of an actually executed k-space trajectory from the nominally planned k-space trajectory.

Scan data MD may be recorded (block 107) using the loaded planned k-space trajectory kTr.

Figure 2:
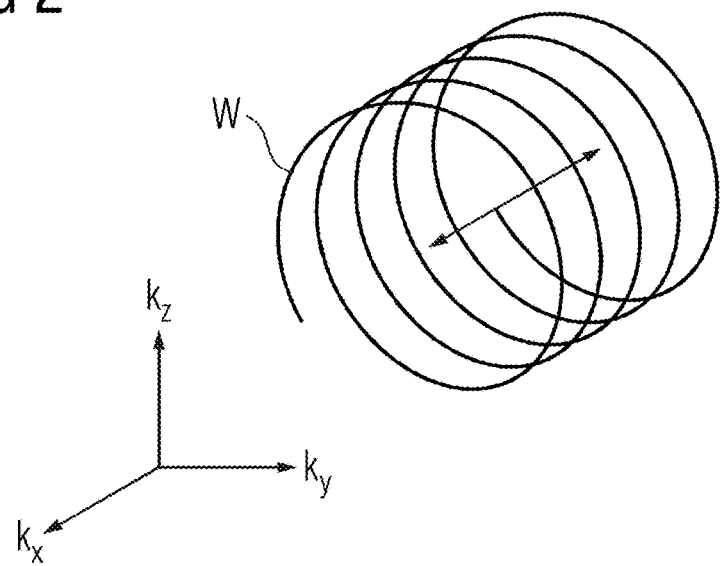
FIG. 2 shows an exemplary helical k-space trajectory according to one or more embodiments of the disclosure.

As an example of a possible planned k-space trajectory, FIG. 2 shows an exemplary helical k-space trajectory W such as can be generated with a wave technique. The k-space trajectory depicted extends in a helical shape along a main direction HR (double arrow), here the $k_x$ direction, with in each case a magnitude and a frequency in directions perpendicular to the main direction and to each other such as specified by gradients switched in the $k_z$ and $k_y$ direction during the readout period.

Figure 3:
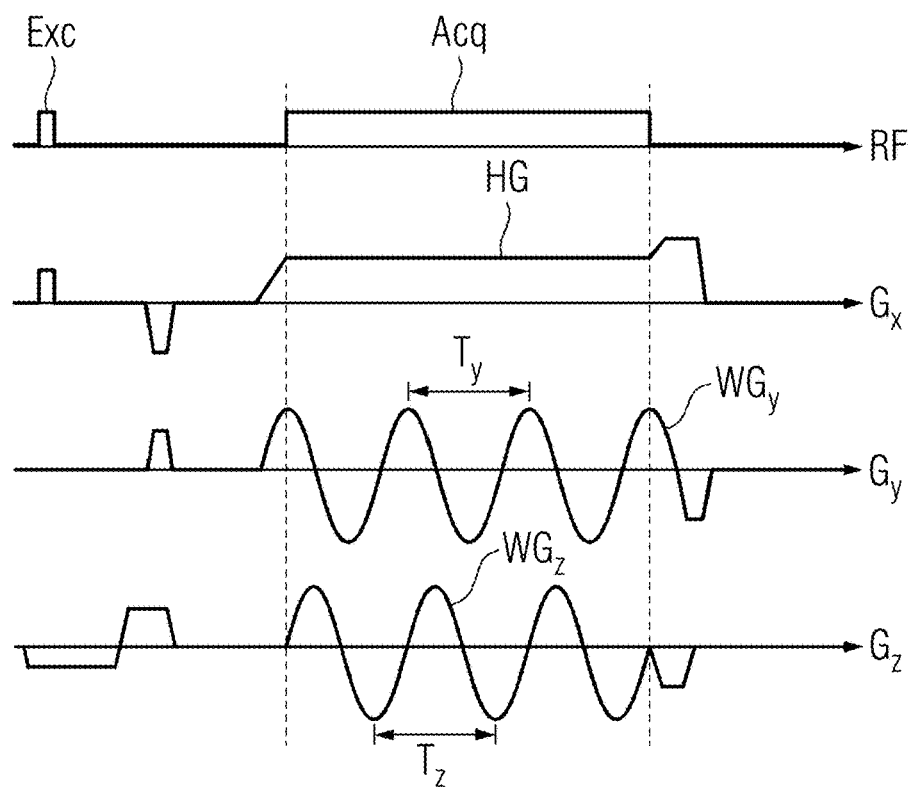
FIG. 3 shows a schematic depiction of part of a pulse sequence scheme for the acquisition of scan data which a k-space trajectory according to FIG. 2 can be achieved, according to one or more embodiments of the disclosure.

For further explanation, FIG. 3 shows a schematic depiction of part of a pulse sequence scheme for the acquisition of scan data with which a k-space trajectory W according to FIG. 2 can be achieved.

The gradients used for position encoding of the signals scanned in a readout period Acq are generated as gradient fields on the orthogonal axes x, y, and z, for example corresponding to the physical axes of the magnetic resonance system, wherein the z direction mostly, but possibly also the x direction, is defined as pointing in the direction of the main magnetic field. The directions x, y, and z may be renamed without restriction of generality. The gradient fields $G_x$, $G_y$, $G_z$ are generated by means of three gradient coils which each respectively generate a field in the x, y, and z directions.

To record scan data of a target region of an examination object, spins in the target region are excited in the usual manner by means of excitation Exc, and the echo signals generated by the excitation Exc are recorded as scan data in a readout period Acq. During the readout period Acq, for the spatial encoding readout gradients HG, $WG_y$, $WG_z$ are switched that define the k-space trajectory, along which the scan data recorded in a readout period Acq is sampled. In the example depicted, a main readout gradient HG is switched in a main readout direction $G_x$ with a constant magnitude during the readout period Acq. At the same time as the main readout gradient HG, i.e., likewise during the readout period Acq, at least one further readout gradient $WG_y$ and/or $WG_z$ is switched, wherein further readout gradients have, for example sinusoidally-modulating magnitude, for example between a positive value of a maximum magnitude and the negative value of the maximum magnitude, each with a frequency $f_y=1/T_y$ or $f_x=1/T_z$, and are switched in a direction $G_y$ or $G_z$ perpendicular to the main readout direction $G_x$. Before and/or after the readout period Acq, further gradients, for example for a possibly desired dephasing or rephasing of the manipulated spins, may be switched in all the gradient axes $G_x$, $G_y$, $G_z$.

Continuing this example, the directions $G_y$ and $G_z$ are likewise perpendicular to one another. This results in a k-space trajectory W which extends in k-space in the direction $k_x$ corresponding to the main readout direction $G_x$, and herein likewise modulates about the direction $k_x$ corresponding to the modulation of the switched further readout gradients $WG_y$ and $WG_x$, as depicted in FIG. 2, for example. In this example, the modulation of the k-space trajectory about the direction $k_x$ corresponding to the main readout direction $G_x$ may also be wave-shaped (if only one further readout gradient $WG_y$ or $WG_z$ is switched) or, as depicted in FIG. 2, helical (if two further readout gradients $WG_y$ and $WG_z$ are switched).

To record a set of scan data from a target region of an examination object from which image data of the target region can be reconstructed, a scheme depicted in FIG. 3 is repeated in the usual manner. For example, with different phase encoding by switching different gradients in the phase encoding direction (not depicted) between the excitation Exc and the readout period Acq, or also with different main readout directions $G_x$, until a set of scan data sufficient for the reconstruction of the desired image data has been recorded.

A further example of a planned k-space trajectory is a spiral k-space trajectory. A spiral k-space trajectory, which, for example, samples k-space in its $k_z$-$k_y$ plane, may be achieved by a pulse sequence scheme, which, unlike the pulse sequence scheme depicted in FIG. 3, does not switch a gradient in the $G_x$ direction in the readout period. Instead of purely sinusoidal or cosinusoidal gradients $WG_y$ and $WG_z$ as in FIG. 3 in the $G_y$ or $G_z$ direction, over the course of time the pulse sequence scheme not only modulates the amplitudes of the gradients switched into these gradient directions sinusoidally and cosinusoidally, but causes them to increase beyond this, resulting in a spiral k-space trajectory.

A value P valid for the planned k-space trajectory is in each case determined (block 103) from at least one parameter characterizing the planned k-space trajectory kTr.

Parameters characterizing the k-space trajectory kTr may be e.g. parameters characterizing gradients to be switched for the generation of the k-space trajectory kTr. These are generally known, since the k-space trajectory kTr has usually been created on the basis of such parameters.

For instance, parameters characterizing the k-space trajectory kTr may comprise at least one parameter from a group of parameters that may include: amplitude, e.g. maximum amplitude, of at least one gradient to be switched for the k-space trajectory kTr, rate of change, i.e., change over time, the amplitude of at least one gradient to be switched for the k-space trajectory kTr, orientation of the k-space trajectory in physical k-space (which results from the gradients to be switched), and basic shape, for example wave or spiral, of the k-space trajectory.

The values P determined for the planned k-space trajectory for the parameters characterizing the k-space trajectory are compared with baseline values $P_B$ of the parameters characterizing the k-space trajectory kTr deposited in a database DB for the magnetic resonance system in each case, together with an associated point spread function $PSF(P_B)$. In this way, baseline values are ascertained of the deposited baseline values $P_B$ that are as similar as possible to the values P determined for the planned k-space trajectory for the parameters characterizing the k-space trajectory kTr and the associated point spread functions that are as similar as possible to the baseline values $PSF(P_B)=PSF_i$ are ascertained (block 105). A similarity can, for example, be determined from the smallest possible (e.g. minimum) difference or a minimum deviation between the values P and the baseline values $P_B$. The PSF $PSF(P_B)$ associated with baseline values $P_B$ deposited in the database DB may, for example, have been determined in advance on the magnetic resonance system or a magnetic resonance system of the same type, possibly by the manufacturer, for example by means of a method as described in the aforementioned article by Cauley et al.

If a planned k-space trajectory kTr is a wave trajectory, a $PSF(P_B)$ can be deposited in the database for at least one direction in which gradients modulated for the wave trajectory are switched.

If a planned k-space trajectory kTr is a wave trajectory, a PSF can be ascertained for each direction in which gradients modulated for the wave trajectory are switched. For example, in the case of a wave trajectory according to the example in FIGS. 2 and 3, values for parameters, e.g. the gradients to be switched in the $G_y$ and $G_z$ direction, may be determined separately from one another and, accordingly, PSFs may be ascertained separately for these directions and deposited in the database DB.

When comparing the values P determined for the parameters with the baseline values $P_B$ to ascertain baseline values that are as similar as possible, a predetermined sequence in which the values of the parameters are compared may be observed. In this way, the search for the baseline values $P_B$ most similar to the determined values P can be made more efficient, and the result may be ascertained more quickly and with better quality. If, for example, a maximum amplitude and a rate of change of the switched gradients, and possibly an orientation of the k-space trajectory in physical k-space, are to be compared as parameters, the amplitude may be compared first and then, e.g. the rate of change, and then e.g. the orientation compared only with the baseline values with the most similar amplitudes.

Additionally or alternatively, during the comparison of the values P determined for the parameters with the baseline values $P_B$ to ascertain baseline values that are as similar as possible, for at least one parameter, at least one threshold value may be specified by which a value of a baseline value may deviate at most from the determined value to be ascertained as a baseline value that is as similar as possible. Thus, a desired similarity may be enforced, and the results of the comparison may be positively influenced. For example, for the parameter of the orientation of the k-space trajectory, a deviation by a maximum angle, for example maximum 45°, may be specified.

Image data $BD_i$ is reconstructed (block 109) on the basis of recorded scan data MD, and the PSF $PSF_i$ associated with the baseline values is ascertained as being as similar as possible. The reconstructed image data $BD_i$ is reconstructed in such a way that it allows conclusions to be drawn about the quality of the reconstruction. For this, it may be sufficient the reconstructed image data $BD_i$ was only reconstructed on the basis of scan data MD recorded in central k-space, and hence have a lower resolution.

If no baseline values can be ascertained as being as similar as possible, a standard PSF or an ideal PSF calculated for the planned k-space trajectory may be used the first time block 109 is executed.

Reconstructed image data $BD_i$ is verified according to a quality criterion Q (query 111). The quality criterion may, for example, be an evaluation of artifacts present in the reconstructed image data $BD_i$, which, for example, either fall below a predetermined threshold value or correspond to an achievable minimum to fulfill the quality criterion Q. For instance, as in the aforementioned article by Cauley et al., an RMSE may be used to check the quality of the reconstructed image data $BD_i$. The quality criterion Q may, e.g. if a minimum is sought, be deemed to be fulfilled if the last values ascertained for the image data $BD_i$ and describing the presence of artifacts, for example RMSE values, no longer differ from one another or only differ from one another by less than a defined (e.g. predetermined) threshold deviation. In this way, it is possible to find a sought-after PSF that is optimal for the reconstruction of the image data.

If a planned k-space trajectory kTr is a wave trajectory, and a $PSF(P_B)$ was deposited in the database for at least one direction in which gradients modulated for the wave trajectory are switched, a sought-after (e.g. target) $PSF_i$ may also be ascertained on the basis of this deposited (e.g. stored) $PSF(P_B)$ for a direction in which gradients modulated for the wave trajectory are switched. A sought-after $PSF_i$ may, for example as in the aforementioned article by Polak et al., be broken down into components, for example according to the switched modulated gradients and possibly a tilt component. Thus, it is also conceivable to deposit only at least one component of a PSF for the baseline values $P_B$ in the database DB.

Any missing components, for example a tilt component of a sought-after $PSF_i$, may be determined in iterations of the check using the quality criterion Q.

The conditions under which the quality criterion is fulfilled, such as, for example, threshold values or threshold deviations, may be adapted depending on baseline values $P_B$ already deposited in the database DB, for example to accelerate a convergence of the iterative search for the sought-after $PSF_i$. For example, it is conceivable to tighten the conditions for fulfillment of the quality criterion Q, the more similar the baseline values $P_B$ determined from the deposited baseline values $P_B$ are to the values P, and/or the more baseline values $P_B$ already stored in the database.

If the quality criterion Q is not fulfilled (query 111, n), the counter i is increased by one (i=i+1), and a further PSF (PSFi, i≠0) is determined (block 113), on the basis of which image data $BD_i$ is reconstructed again (block 109 is carried out again with a new $PSF_i$). This process may continue until the quality criterion Q is fulfilled or until the counter i achieves a predetermined maximum value N (i≤N). To ascertain a further $PSF_i$, i≠0, for example, one of the baseline values ascertained as being as similar as possible may be varied. Here, once again it is possible to proceed analogously to the method described in the aforementioned article by Cauley et al.

If the quality criterion Q is fulfilled (query 111, y), the last-ascertained PSF PSFi can be used as the sought-after $PSF_i$ for the reconstruction of final image data BD on the basis of all scan data MD to be recorded (block 109, "if 111 y"). If the last reconstructed image data $BD_i$ has already been reconstructed on the basis of all scan data MD to be recorded, the last reconstructed image data $BD_i$ may be the final image data BD.

Furthermore, if the quality criterion Q is fulfilled (query 111, y), the last determined PSF $PSF_i(P)$, together with the values P for parameters characterizing the planned k-space trajectory kTr, may be deposited in the database DB as new baseline values $P_B$. In this way, the database DB is skillfully expanded by data that is relevant, because it is used in actual scans. If scans, the parameter values of which are not changed or are only slightly changed, are carried out more frequently on the magnetic resonance system with a k-space trajectory, this can considerably accelerate the iterative reconstruction of image data $BD_i$.

PSFs deposited in the database DB may be deposited as an associated modulation transfer function MTF. These may comprise (e.g. only) the frequency components of the PSF and therefore require less memory.

It is furthermore conceivable that baseline values $P_B$ deposited in the database DB with an associated PSF PSF ($P_B$) are given a time stamp when deposited, and baseline values $P_B$ with an associated PSF PSF($P_B$) with a time stamp that has a time interval from a current date that is greater than a specified value for a maximum deposit duration are removed from the database DB. Although the PSF for a given magnetic resonance system should not change, this is a way of ensuring that the baseline values PB and associated PSF PSF($P_B$) deposited in the database are always sufficiently up-to-date, so that any changes that may occur, for example when hardware components, such as e.g. the gradient unit are changed, do not have a negative impact on the method. In addition, in this way it can be achieved that the database DB is not excessively filled, which, inter alia, may prolong a comparison to determine similar baseline values.

Figure 4:
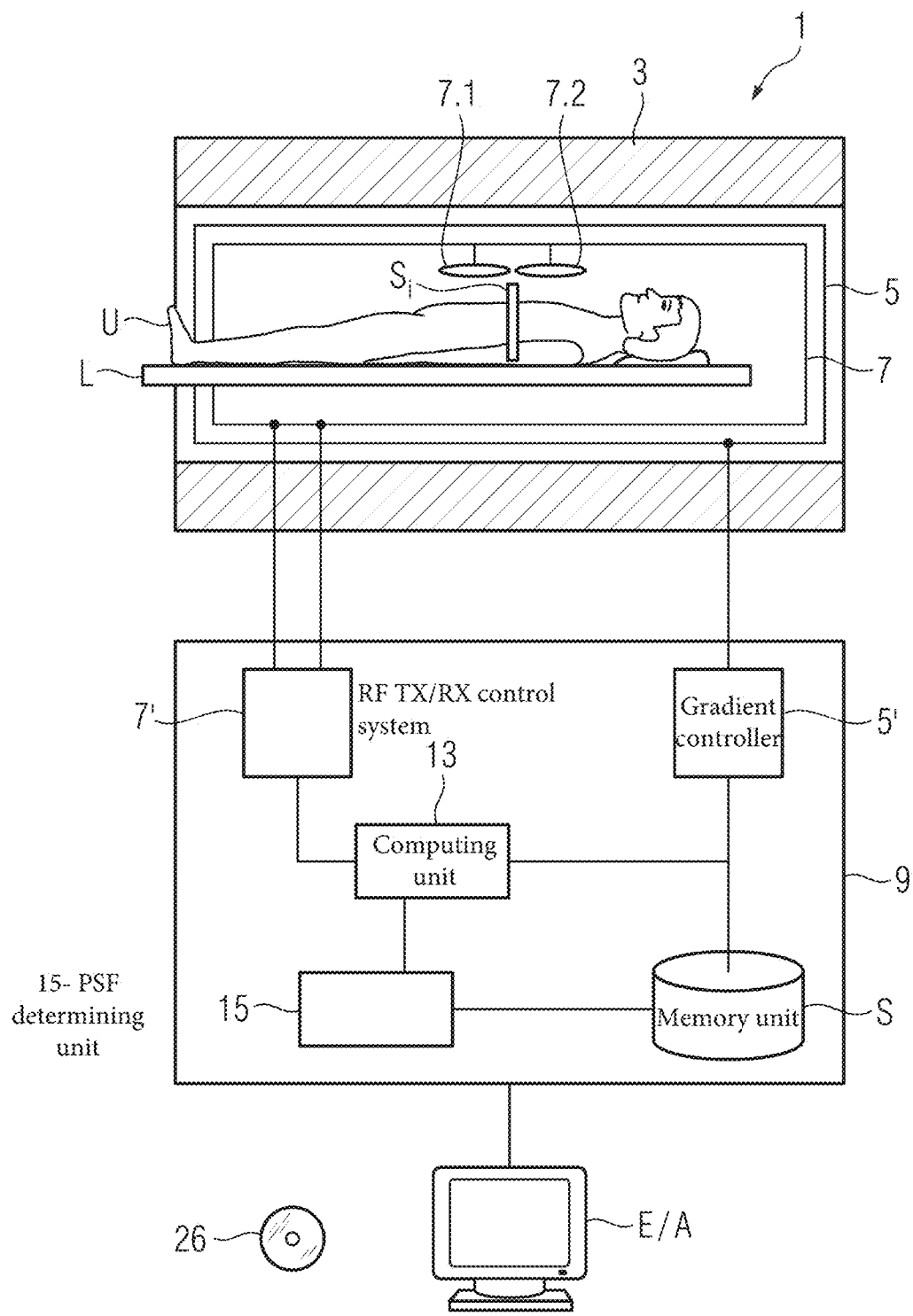
FIG. 4 shows a schematic depiction of a magnetic resonance system according to one or more embodiments of the disclosure.

FIG. 4 is a schematic depiction of a magnetic resonance system 1 according to the one or more embodiments of the disclosure. The magnetic resonance system 1 comprises a magnet unit 3 (e.g. a magnet and/or associating drivers and hardware components) for generating the basic magnetic field, a gradient unit (e.g. gradient generation circuitry, which may include one or more processors, processing circuitry, hardware, software, executable instructions, or combinations of these) 5 for generating the gradient fields, a radio-frequency unit (e.g. RF generation circuitry, which may include one or more processors, processing circuitry, hardware, software, executable instructions, or combinations of these) 7 for irradiating and receiving radio-frequency signals, and a control facility (e.g. a computing device, controller, and/or control circuitry, which may include one or more processors, processing circuitry, hardware, software, executable instructions, or combinations of these) 9 embodied to carry out one or more methods according to the disclosure.

FIG. 4 is a schematic depiction of partial units of the magnetic resonance system 1, and may include additional, or alternate components. For instance, the radio-frequency unit 7 may include a plurality of subunits, for example a plurality of coils, such as the schematically depicted coils 7.1 and 7.2, or more coils, which can be implemented to transmit RF signals and/or to receive the triggered RF signals.

For an examination of an examination object U, for example a patient or a phantom, the object may be introduced into the scanning volume of the magnetic resonance system 1 on a bench L. The slice or slab Si represents an exemplary target volume of the examination object to be recorded from the echo signals and acquired as scan data.

The control facility 9 is used to control the magnetic resonance system 1 and may for instance control the gradient unit 5 via a gradient controller (e.g. gradient control circuitry, which may include one or more processors, processing circuitry, hardware, software, executable instructions, or combinations of these) 5' and the radio-frequency unit 7 by means of a radio-frequency transmission/reception control system (e.g. RF transmission/reception circuitry, which may include one or more processors, processing circuitry, hardware, software, executable instructions, or combinations of these) 7'. In this connection, the radio-frequency unit 7 may comprise a plurality of channels on which signals can be sent or received.

Together with its radio-frequency transmission/reception control system 7', the radio-frequency unit 7 is responsible for generating and irradiating (transmitting) an alternating radio-frequency field for manipulating the spins in a region to be manipulated (for example in slices S to be scanned) of the examination object U. Herein, if possible, the mid-frequency of the alternating radio-frequency field, also referred to as the B1 field, is generally ideally set close to the resonance frequency of the spins to be manipulated. Deviations of the mid-frequency from the resonance frequency are referred to as off-resonance. To generate the B1 field, controlled currents are applied to the RF coils in the radio-frequency unit 7 via the radio-frequency transmission/reception control system 7'.

Furthermore, the control facility 9 comprises a PSF-determining-unit 15 (e.g. PSF-determining circuitry, which may include one or more processors, processing circuitry, hardware, software, executable instructions, or combinations of these), with which PSFs according to the disclosure can be determined for conversion by the gradient controller 5'. The control facility 9 is implemented to execute one or more methods according to the disclosure.

A computing unit 13 (e.g. a computing device, controller, and/or control circuitry, which may include one or more processors, processing circuitry, hardware, software, executable instructions, or combinations of these) comprised by the control facility 9 is embodied to execute all the computing operations required for the necessary scans and determinations. Interim results and results required for this purpose or ascertained in this connection can be stored in a memory unit S of the control facility 9. Continuing this example, the units depicted should not necessarily be understood as being physically separate units, but may represent a subdivision into coherent units but which can also be implemented, for example, in fewer units or even only one single physical unit.

An input/output facility E/A of the magnetic resonance system 1 can, for example, be used by a user to route control commands to the magnetic resonance system 1 and/or to display results of the control facility 9 such as, for example, image data.

A method described herein can also be present in the form of a computer program product (e.g. a non-transitory computer-readable medium), which comprises a program and implements the described method on a control facility 9 when it is executed on the control facility 9. Likewise, an electronically readable data carrier 26 (e.g. a non-transitory computer-readable medium) may be provided with electronically readable control information stored thereon, which comprises at least one above-described computer program product and is implemented to execute the described method when the data carrier 26 is used in a control facility 9 of the magnetic resonance system 1.

What is claimed is:

1. A method for ascertaining a point spread function (PSF) for reconstructing image data from scan data recorded using a magnetic resonance system, comprising:
    loading a k-space trajectory for a magnetic resonance measurement;
    iteratively comparing (i) valid values determined for the k-space trajectory using at least one parameter characterizing the k-space trajectory, with (ii) stored baseline values of parameters characterizing the k-space trajectory that are stored in a database to ascertain, from the stored baseline values, selected baseline values that minimally deviate from the values determined for the k-space trajectory;
    recording scan data using the k-space trajectory;
    iteratively reconstructing image data using the recorded scan data and a target PSF that is associated with the selected baseline values; and
    verifying reconstructed image data according to a quality criterion,
    wherein, when the quality criterion is not fulfilled, determining a further target PSF by iteratively repeating the act of reconstructing the image data, and
    wherein, when the quality criterion is fulfilled, using a most recent target PSF from the iterative comparing of the valid values to the stored baseline values for the reconstruction of final image data.

2. The method as claimed in claim 1, wherein, when the quality criterion is fulfilled, storing the most recent target PSF in the database with the selected baseline values as updated baseline values.

3. The method as claimed in claim 1, wherein, when no selected baseline values can be ascertained, the method further comprises:
    using an ideal PSF as the target PSF, the ideal PSF being calculated for the k-space trajectory for a first iteration of the act of iteratively reconstructing the image data.

4. The method as claimed in claim 1, wherein the at least one parameter characterizing the k-space trajectory includes at least one parameter that characterizes gradients to be switched to generate the k-space trajectory.

5. The method as claimed in claim 1, wherein the at least one parameter characterizing the k-space trajectory includes a maximum amplitude of at least one gradient to be switched to generate the k-space trajectory.

6. The method as claimed in claim 1, wherein the at least one parameter characterizing the k-space trajectory includes a rate of change of the amplitude of at least one gradient to be switched to generate the k-space trajectory.

7. The method as claimed in claim 1, wherein the at least one parameter characterizing the k-space trajectory includes an orientation of the k-space trajectory in physical k-space.

8. The method as claimed in claim 1, wherein the at least one parameter characterizing the k-space trajectory includes a shape of the k-space trajectory.

9. The method as claimed in claim 1, wherein the act of iteratively comparing the valid values with the stored baseline values comprises performing the iterative comparison in accordance with a predetermined sequence.

10. The method as claimed in claim 1, wherein the act of iteratively comparing the valid values with the stored baseline values comprises identifying a deviation between the valid values and the stored baseline values that is less than a predetermined threshold value.

11. The method as claimed in claim 1, wherein the k-space trajectory comprises a wave trajectory.

12. The method as claimed in claim 1, wherein the k-space trajectory comprises a spiral k-space trajectory.

13. The method as claimed in claim 1, wherein the k-space trajectory comprises a wave trajectory, and
    wherein the target PSF is determined for each direction in which modulated gradients are switched.

14. The method as claimed in claim 1, wherein the target PSF is stored in the database as a modulation transfer function (MTF).

15. The method as claimed in claim 1, wherein each respective one of the baseline values stored in the database has a corresponding time stamp identified with a time each respective baseline value was stored,
    wherein the database stores a plurality of PSFs, each respective one of the PSFs having a corresponding time stamp, and further comprising:
    removing, from the database, PSFs from among the plurality of PSFs that have a corresponding time stamp that exceeds a predetermined time interval from a current time.

16. A magnetic resonance system, comprising:
    a main magnet; and
    control circuitry configured to control the magnetic resonance system to ascertain a point spread function (PSF) for reconstructing image data from recorded scan data by:
    loading a k-space trajectory for a magnetic resonance measurement;
    iteratively comparing (i) valid values determined for the k-space trajectory using at least one parameter characterizing the k-space trajectory, with (ii) stored baseline values of parameters characterizing the k-space trajectory that are stored in a database to ascertain, from the stored baseline values, selected baseline values that minimally deviate from the values determined for the k-space trajectory;
    recording scan data using the k-space trajectory;
    iteratively reconstructing image data using the recorded scan data and a target PSF that is associated with the selected baseline values; and
    verifying reconstructed image data according to a quality criterion,
    wherein, when the quality criterion is not fulfilled, determining a further target PSF by iteratively repeating the act of reconstructing the image data, and
    wherein, when the quality criterion is fulfilled, using a most recent target PSF from the iterative comparing of the valid values to the stored baseline values for the reconstruction of final image data.

17. A non-transitory computer-readable medium having instructions stored thereon that, when executed by control circuitry of a magnetic resonance system, cause the magnetic resonance system to ascertain a point spread function (PSF) for reconstructing image data from recorded scan data by:
- loading a k-space trajectory for a magnetic resonance measurement;
- iteratively comparing (i) valid values determined for the k-space trajectory using at least one parameter characterizing the k-space trajectory, with (ii) stored baseline values of parameters characterizing the k-space trajectory that are stored in a database to ascertain, from the stored baseline values, selected baseline values that minimally deviate from the values determined for the k-space trajectory;
- recording scan data using the k-space trajectory;
- iteratively reconstructing image data using the recorded scan data and a target PSF that is associated with the selected baseline values; and
- verifying reconstructed image data according to a quality criterion,
- wherein, when the quality criterion is not fulfilled, determining a further target PSF by iteratively repeating the act of reconstructing the image data, and
- wherein, when the quality criterion is fulfilled, using a most recent target PSF from the iterative comparing of the valid values to the stored baseline values for the reconstruction of final image data.

\* \* \* \* \*